(12) United States Patent
Imai

(10) Patent No.: US 8,344,329 B2
(45) Date of Patent: Jan. 1, 2013

(54) RADIATION SENSOR AND RADIATION IMAGE DETECTION APPARATUS

(75) Inventor: Shinji Imai, Kanagawa (JP)

(73) Assignee: FUJIFILM Corporation, Tokyo (JP)

(\*) Notice: Subject to any disclaimer, the term of this patent is extended or adjusted under 35 U.S.C. 154(b) by 242 days.

(21) Appl. No.: 12/958,830

(22) Filed: Dec. 2, 2010

(65) Prior Publication Data
US 2011/0133095 A1    Jun. 9, 2011

(30) Foreign Application Priority Data
Dec. 9, 2009 (JP) .................. 2009-279612

(51) Int. Cl.
*G01T 1/24* (2006.01)

(52) U.S. Cl. ................................. 250/370.08

(58) Field of Classification Search ............. 250/370.01, 250/370.08, 370.11
See application file for complete search history.

(56) References Cited

U.S. PATENT DOCUMENTS
2004/0104365 A1    6/2004    Imai

FOREIGN PATENT DOCUMENTS
JP    2004-172375 A    6/2004
JP    2006-165530 A    6/2006

OTHER PUBLICATIONS

Chuang, et al. "P-13: Photosensitivity of Amorphous IGZO TFTs for Active-Matrix Flat-panel Displays," Journal of the Society for Information Display Digest. vol. 8, p. 1215-1218, 2008.

*Primary Examiner* — Mark R Gaworecki
(74) *Attorney, Agent, or Firm* — Birch, Stewart, Kolasch & Birch, LLP

(57) ABSTRACT

Provided is a radiation sensor comprising: a phosphor layer that converts incident radiation into converted light containing a first light component having a first wavelength region that includes a maximum peak wavelength different from a maximum peak wavelength of the radiation, and a second light component having a second wavelength region of 400 nm to 460 nm, different from that of the radiation and the first wavelength region; an organic photoelectric conversion layer; and an insulating substrate provided with a charge detection layer, and that includes a storage capacitor and a thin film transistor having an oxide semiconductor active layer, wherein the first and second light components each pass through the organic photoelectric conversion layer and arrive at the oxide semiconductor active layer, and wherein an intensity of the second light component is lower than an intensity of the first light component.

17 Claims, 3 Drawing Sheets

RADIATION SENSOR AND RADIATION IMAGE DETECTION APPARATUS

CROSS-REFERENCE TO RELATED APPLICATION

This application claims priority under 35 USC 119 from Japanese Patent Application No. 2009-279612, filed on Dec. 9, 2009, the disclosure of which is incorporated by reference herein.

BACKGROUND OF THE INVENTION

1. Field of the Invention

The present invention relates to a radiation sensor and a radiation image detection apparatus.

2. Description of the Related Art

In the field of medicine, use is being made of a radiation sensor which irradiates a human body with a radiation such as X-ray, detects the intensity of the radiation that has transmitted into the human body, and thereby detects the images of the inside of the human body. One type of such a radiation sensor is a system which first enters a radiation that has transmitted into the human body, into a phosphor to thereby convert the radiation into visible light, converting this visible light into electrical signals, and then extracting the electrical signals to the outside.

As such a radiation sensor, for example, there is known a radiation sensor in which a impact-resistant phosphor layer composed of a phosphor that is sensitive to radiation, such as gadolinium oxysulfide; an upper electrode; a lower electrode; and a impact-resistant support which is disposed between the upper and lower electrodes, and has an organic photoelectric conversion layer that absorbs the light emitted by the radiation incident to the phosphor layer to convert the light to charges, and a charge detection layer that includes a storage capacitor and a thin film transistor unit for reading the charges generated in the organic photoelectric conversion layer from each of the pixels for image detection (see Japanese Patent Application Laid-Open (JP-A) No. 2004-172375). Furthermore, since a thin film transistor which has an oxide semiconductor active layer containing zinc oxide, may be formed into a film at low temperature, an insulating substrate having impact resistance, such as a plastic plate or a plastic film, may be used (see JP-A No. 2004-172375 and JP-A No. 2006-165530).

However, a thin film transistor which uses an oxide semiconductor, particularly an oxide semiconductor containing indium (In), gadolinium (Ga) and zinc (Zn) among others, as an active layer has a property that the threshold voltage shifts to a negative value when it is irradiated with light having a wavelength of 460 nm or less [see Chiao-Shun Chuang, et al. (University of Michigan), "P-13: Photosensitivity of Amorphous IGZO TFTs for Active-Matrix Flat-panel Displays," "SID 08 DIGEST," pp. 1215-1218 (2008)]. Therefore, when the thin film transistor is repeatedly irradiated with light having a wavelength of 460 nm or less, threshold shifts accumulate, and the operation of the thin film transistor becomes unstable, so that the operation as a radiation sensor may become unstable.

SUMMARY OF THE INVENTION

The present invention has been made in view of the above circumstances and provides radiation sensor and radiation image detection apparatus.

A first aspect of the invention provides a radiation sensor including: a phosphor layer that converts incident radiation into converted light which contains a first light component having a first wavelength region that includes a maximum peak wavelength that is different from a maximum peak wavelength of the radiation, and a second light component having a second wavelength region of 400 nm to 460 nm, which is different from that of the radiation and different from the first wavelength region; an organic photoelectric conversion layer that photoelectrically converts the first light component to electricity; and an insulating substrate that is provided with a charge detection layer to read charges generated at the organic photoelectric conversion layer, and that includes a storage capacitor and a thin film transistor having an oxide semiconductor active layer, wherein the first and second light components each pass through the organic photoelectric conversion layer and arrive at the oxide semiconductor active layer, and wherein an intensity of the second light component that passes through the organic photoelectric conversion layer and arrives at the oxide semiconductor active layer, is lower than an intensity of the first light component that passes through the organic photoelectric conversion layer and arrives at the oxide semiconductor active layer.

A second aspect of the present invention provides a radiation image detection apparatus including: a radiation irradiating apparatus; the radiation sensor of the first aspect of the present invention; and a memory unit that allows accumulation therein of charge data of pixel units detected at the charge detection layer of the radiation sensor.

DETAILED DESCRIPTION OF THE INVENTION

Figure 1:
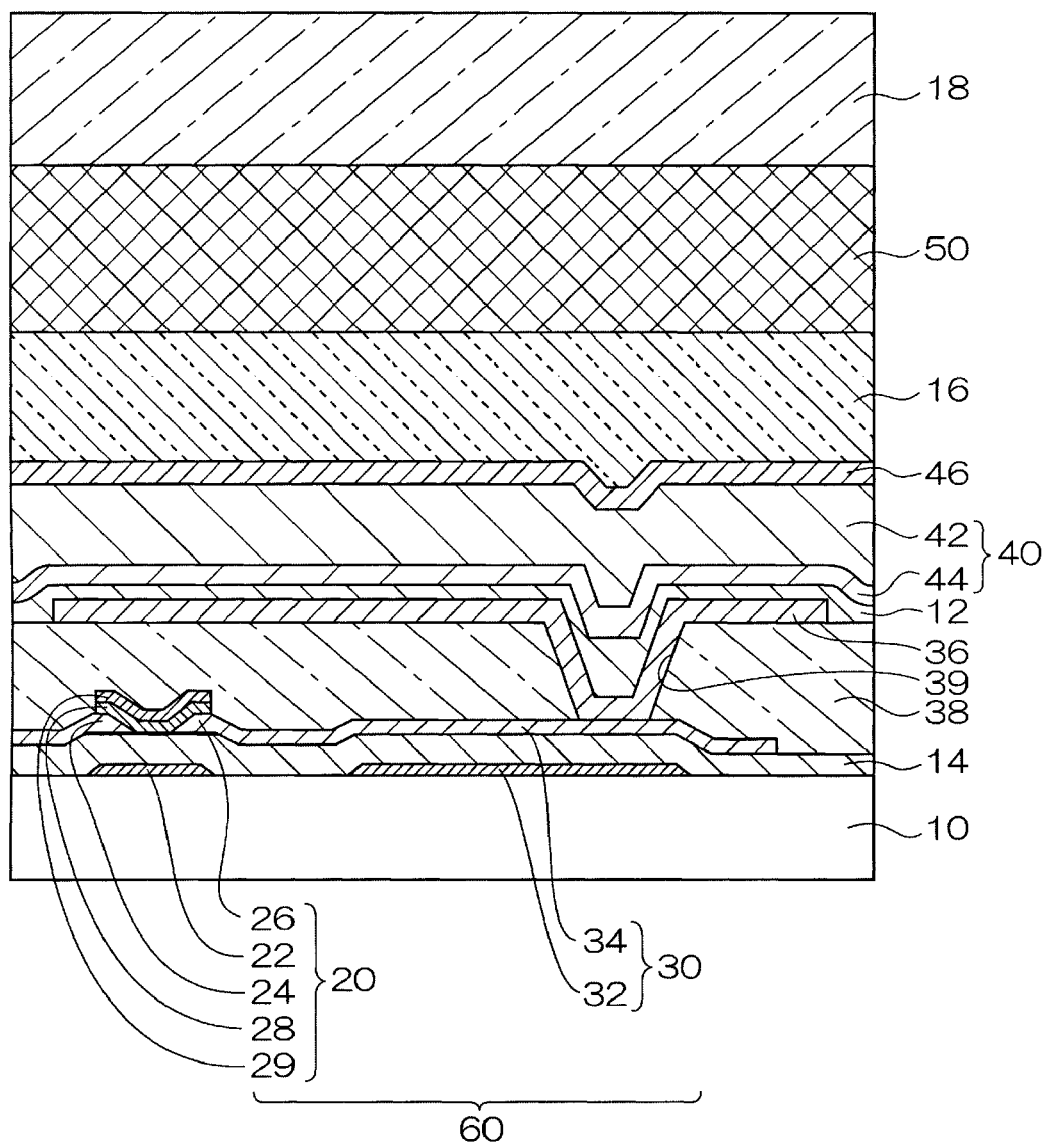
FIG. 1 is a cross-sectional view illustrating an example of the configuration of one pixel unit of a radiation sensor according to an exemplary embodiment of the invention.

FIG. 1 is a cross-sectional view schematically illustrating the configuration of one pixel unit of a radiation sensor related to an exemplary embodiment of the radiation sensor according to the invention. In FIG. 1, a phosphor layer 50 which, when an imaging target as an object of imaging is exposed to radiation, converts the radiation that has transmitted into the imaging target, into light, is provided on one of the surfaces of a plastic support 18 such as a polyethylene terephthalate support.

Furthermore, the radiation sensor has a charge detection layer 60 which includes a storage capacitor 30 and a thin film transistor 20, on one of the surfaces of an insulating substrate 10. The storage capacitor 30 is constituted of a upper storage capacitor electrode 34 and a lower storage capacitor electrode 32, and a dielectric layer 14 disposed between these electrodes (this dielectric layer 14 also functions as an insulating film). Furthermore, this thin film transistor 20 has a source electrode 24, a drain electrode 26 that is connected to the upper storage capacitor electrode 34, an oxide semiconductor active layer (channel layer) 28 that is disposed between these source electrode 24 and drain electrode 26, a protective layer 29 formed to cover the oxide semiconductor active layer 28, and a gate electrode 22 that is positioned to face the oxide semiconductor active layer 28, with the dielectric layer 14 that functions as an insulating film being interposed between the gate electrode and the oxide semiconductor active layer.

A first interlayer insulating film 38 is disposed on the charge detection layer 60, and this first interlayer insulating film 38 has a contact hole 39 on the upper storage capacitor electrode 34. A charge collection electrode 36 is disposed on the first interlayer insulating film 38, and this charge collection electrode 36 is electrically connected to the upper storage capacitor electrode 34 at the contact hole 39.

An organic photoelectric conversion layer 40 which includes a charge generation layer 44 and a charge transport layer 42, and a bias electrode 46 are disposed in this sequence on the charge collection electrode 36, with an undercoat layer 12 interposed between the organic photoelectric conversion layer and the charge collection electrode. The bias electrode 46 and the phosphor layer 50 are layered via a second interlayer insulating film 16 in such a manner as to face each other.

Figure 2:
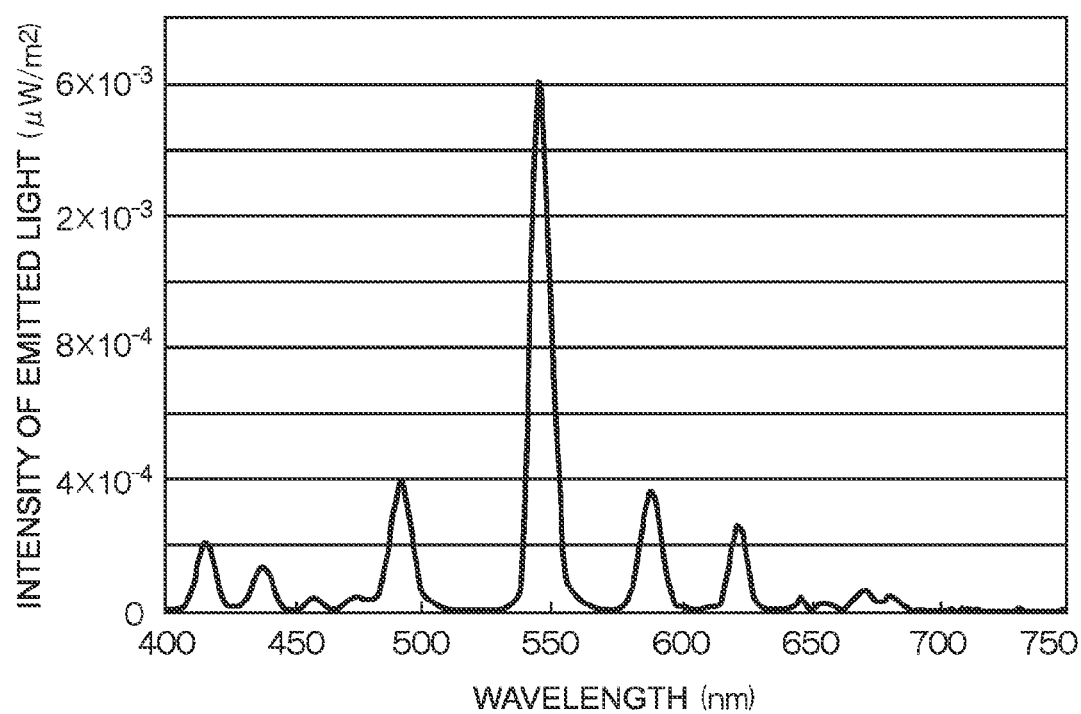
FIG. 2 is a graph illustrating the X-ray emission spectrum of gadolinium oxysulfide.
Figure 3:
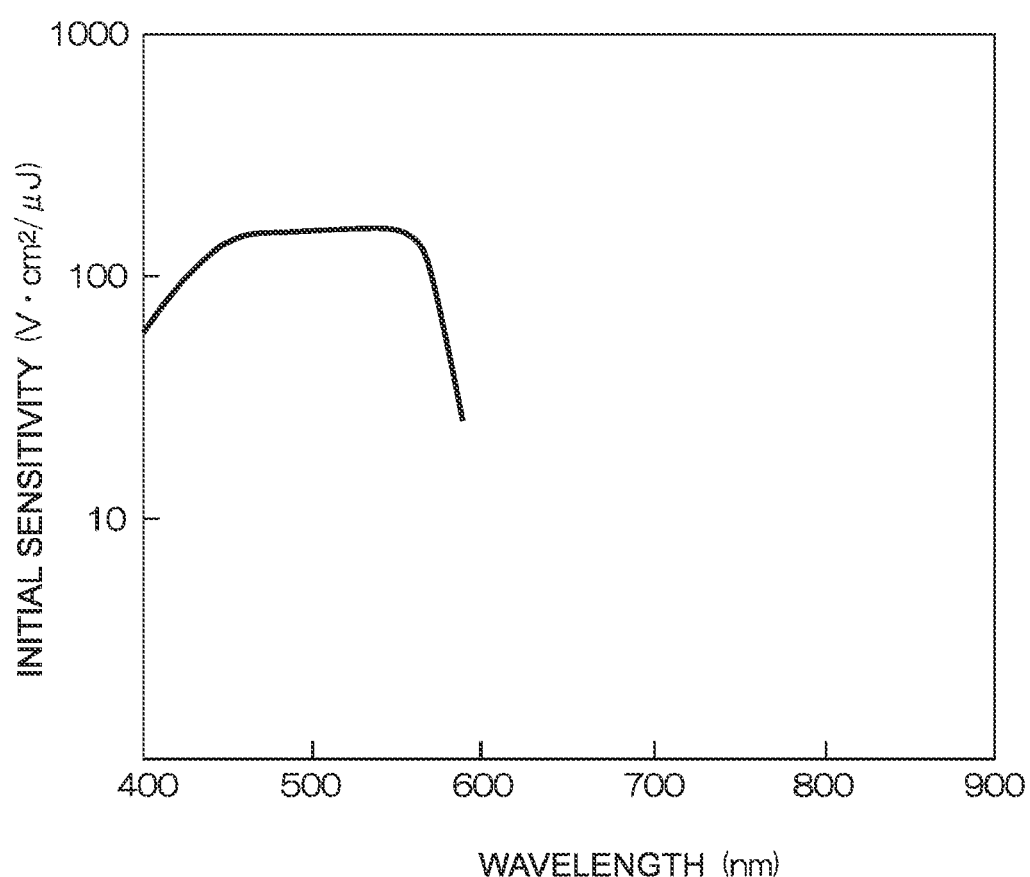
FIG. 3 is a graph illustrating the spectral sensitivity curve of dibromoanthanthrone.

The phosphor layer 50 converts the radiation into converted light which contains a first light component having a first wavelength region that includes a maximum peak wavelength that is different from the maximum peak wavelength of the radiation, and a second light component having a second wavelength region of 400 nm to 460 nm, which is different from the radiation and the light of the first wavelength region. The converted light that contains at least the first light component is converted into charges at the organic photoelectric conversion layer 40. For example, when the phosphor layer 50 contains $Gd_2O_2S$:Tb (gadolinium oxysulfide; hereinafter, also referred to as "GOS") as a phosphor, as shown in FIG. 2, the phosphor layer emits a second light component having a second wavelength region of 400 nm to 460 nm together with, a first light component having a maximum peak wavelength of 550 nm as a result of X-ray irradiation. Then, as shown in FIG. 3, dibromoanthanthrone which absorbs the light having a wavelength in the range of 400 nm to 600 nm and generates charges, is used in the charge generation layer 44 of the organic photoelectric conversion layer 40.

The charges converted at the organic photoelectric conversion layer 40 are read at the charge detection layer 60. The charge detection layer 60 includes a number of pixel units, though not shown, that are spread in two-dimensional directions, and each pixel unit includes a storage capacitor 30 and a thin film transistor 20. The charges converted at the organic photoelectric conversion layer 40 migrate as a result of the difference in the voltage applied between the bias electrode 46 and the charge collection electrode 36, and are collected at the charge collection electrode 36. The collected charges may accumulate in the storage capacitor 30 which includes the storage capacitor upper electrode 34 that is electrically connected with the charge collection electrode 36, the storage capacitor lower electrode 32, and the dielectric layer that is interposed between these electrodes.

The thin film transistor 20 including the oxide semiconductor active layer 28 is formed on the insulating substrate 10 by a lithographic process or the like. When an amorphous oxide semiconductor such as an oxide containing In, Ga and Zn is used as the oxide semiconductor active layer 28, film forming may be achieved at low temperature by sputtering. Accordingly, a plastic substrate which is not likely to break even under an impact may be used as the insulating substrate 10.

On the other hand, the amorphous oxide semiconductor described above has a property of shifting the threshold voltage of the thin film transistor 20 to a negative value when the oxide semiconductor receives the second light component having a second wavelength region of 400 nm to 460 nm. However, as discussed above, when dibromoanthanthrone that exhibits absorption of light having a wavelength in the range of 400 nm to 600 nm is used in the charge generation layer 44 of the organic photoelectric conversion layer 40, the second light component is absorbed at the organic photoelectric conversion layer 40, and the intensity of the light arriving at the oxide semiconductor active layer 28 decreases. Here, the intensity of the second light component arriving at the oxide semiconductor active layer 28 is considered to be lower than the intensity of the first light component that is similarly absorbed at the same organic photoelectric conversion layer 40 and then arrives at the oxide semiconductor active layer 28. Thus, even if the oxide semiconductor active layer 28 is irradiated with the second light component, shifting of the threshold voltage of the thin film transistor 20 to a negative value is prevented. Therefore, the stability of operation of the thin film transistor 20 is secured.

When charges accumulate in the storage capacitor 30, there is an electric potential difference across the storage capacitor lower electrode 32 and the storage capacitor upper electrode 34 in accordance with the amount accumulated. Since the storage capacitor upper electrode 34 is electrically connected to the drain electrode 26, when the thin film transistor 20 is brought to the on-state by the input signal via the gate electrode 22, the charges that have accumulated in the storage capacitor 30 are extracted through the source electrode 24. The amount of charges produced by the electromagnetic waves irradiated as such is detected for every pixel, and is stored as data in, for example, a semiconductor memory unit. When the data stored in the semiconductor memory unit are outputted as electric signals, image detection of the entire imaging target may be achieved.

The radiation sensor according to the invention obtains image data with the use of the first light component having the maximum peak wavelength among the light components from the phosphor layer 50. On the other hand, the second light component emitted from the same phosphor layer 50 is absorbed by the organic photoelectric conversion layer 40, and its intensity is reduced. Thus, when the intensity of the second light component that arrives at the oxide semiconductor active layer 28 is made lower than the intensity of the first light component that is similarly absorbed by the organic photoelectric conversion layer 40 and arrives at the oxide semiconductor active layer 28, the adverse effects on the oxide semiconductor active layer 28 exerted by the irradiation with the second light are prevented. Therefore, the feature obtainable by using the oxide semiconductor active layer 28, that is, the feature of being capable of forming films at low temperature by sputtering, allows the use of plastic substrates, and a radiation sensor exhibiting stabilized operation irrespective of the use of plastic substrates is obtained. Therefore, a radiation sensor which achieves a good balance between impact resistance and operation stability is obtained.

Furthermore, since the intensity of the second light component, which has adverse effects on the acquiring of image data and the oxide semiconductor active layer 28, is reduced by a single organic photoelectric conversion layer 40, there is no need to additionally include, for example, a filter layer for reducing the intensity of the second light component, apart from the organic photoelectric conversion layer 40 for obtaining image data, and therefore, a radiation sensor with a simpler structure may be obtained. Therefore, this leads to a notable advantage in the case of mounting a radiation sensor in a lightweight, slim cassette. Particularly, when a plastic substrate such as a polyimide substrate is used as the insulating substrate 10, the radiation sensor may maintain high robustness which prevents impediment to the functions even if the cassette is mistakenly dropped and the radiation sensor is subject to an impact.

A preferable group of phosphors that may be used in the phosphor layer 50 of the radiation sensor according to the invention includes (a) phosphors emitting, when exposed to radiation, light having a spectrum which includes a plural peaks that have mutually different maximum wavelengths and narrow widths at half-maximum, and (b) phosphors emitting, when exposed to radiation, light having a spectrum that has one maximum wavelength and a broad wavelength range.

When X rays are used as the radiation, the phosphors belonging to the group (a) preferably includes, for example, gadolinium oxysulfide. Gadolinium oxysulfide, when exposed to X-ray radiation, has an emission spectrum which includes a sharp peak having the maximum peak wavelength at 550 nm, and peaks having their maximum wavelengths at near 420 nm, near 440 nm, near 490 nm, near 580 nm, and near 620 nm.

The phosphors belonging to the group (b) preferably include cesium iodide, and more preferably a cesium iodide containing thallium, which has an emission spectrum in the range of 420 nm to 600 nm when the emission spectrum is obtained as a result of the X-ray radiation.

The organic photoelectric conversion layer 40 of the radiation sensor of the invention absorbs the first light component from the phosphor layer 50 and generates charges. Furthermore, it is preferable that the organic photoelectric conversion layer 40 absorbs the second light component and thereby lowers as much as possible the intensity of the second light component that arrives at the oxide semiconductor active layer lying behind the organic photoelectric conversion layer. Therefore, the layers forming the organic photoelectric conversion layer 40, particularly the charge generation layer 44 among them is selected from the materials capable of absorbing the first light component and the second light component.

Examples of the charge generating agent that is used in such a charge generation layer include anthanthrone and a halogen substitute thereof such as dibromoanthanthrone. Dibromoanthanthrone absorbs, as shown in FIG. 3, light having a wavelength in the range of 400 nm to 600 nm, that is, the first light component and the second light component. On the other hand, the charge generating agent is a charge generating agent that absorbs the first light component and carries out photoelectric conversion, but does not exhibit light absorbability for the second light component. For example, if quinacridone is used, there is a risk that the intensity of the second light component that has permeated through the charge generation layer may become higher than the intensity of the first light component. Accordingly, it is not preferable in the present invention.

Thus, when gadolinium oxysulfide or cesium iodide is used in the phosphor layer 50, and dibromoanthanthrone is used as the charge generating agent used in the charge generation layer 44, the first light component coming from the phosphor layer 50 includes the maximum peak wavelength at 550 nm, and this first light component is absorbed by the charge generation layer 44 to be efficiently photoelectrically converted. On the other hand, the light having a wavelength of 400 nm to 460 nm, which is the second light component, coming from the phosphor layer 50, is also absorbed by the charge generation layer 44, and therefore, the intensity of the second light component that arrives at the oxide semiconductor active layer 28 is markedly decreased. Therefore, the shifting of the threshold voltage of the thin film transistor no longer occurs, so that the stabilized operation is secured.

Hereinafter, the sensor according to the exemplary embodiment and the method for producing the same will be described in more detail. In addition, the materials of the various constituent elements, the method for film formation, and the film thickness that will be explained below, are described as an example for illustrative purposes, and may be appropriately selected in accordance with the purpose of the sensor, the type of the electromagnetic wave of the object of detection, and the like.

<Insulating Substrate>

As the insulating substrate 10, use is made of a substrate having a strength that is capable of supporting other constituent elements (image detection elements), and examples thereof include a glass substrate, a silicon substrate provided with an insulating layer, a substrate obtained by adhering of a polyethylene terephthalate (PET) film and a glass substrate, a metal substrate provided with an insulating layer; plastic substrates such as a polyethylene terephthalate (PET) resin substrate, a polyethylene naphthalate (PEN) resin substrate, a crosslinked fumaric acid diester-based resin substrate, a polycarbonate (PC)-based resin substrate, a polyether sulfone (PES) resin substrate, a polysulfone (PSF, PSU) resin substrate, a polyallylate (PAR) resin substrate, a cyclic polyolefin (COP, COC) resin substrate, a cellulose-based resin substrate, a polyimide (PI) resin substrate, a polyamideimide (PAI) resin substrate, a maleimide-olefin resin substrate, a polyamide (PA) resin substrate, an acrylic resin substrate, a fluorine-based resin substrate, an epoxy-based resin substrate, a silicone-based resin film substrate, a polybenzazole-based resin substrate, a substrate based on an episulfide compound, a liquid crystalline polymer (LCP) substrate, a cyanate-based resin substrate, and an aromatic ether-based resin substrate; composite materials made of silicon oxide particles, metallic nanoparticles, inorganic oxide nanoparticles, inorganic nitride nanoparticles and the like with the plastics mentioned above; composite materials made of metallic or inorganic nanofibers or microfibers with the plastics mentioned above; composite materials made of carbon fibers or carbon nanotubes with the plastics mentioned above; composite materials made of glass flakes, glass fibers and glass beads with the plastics mentioned above; composite materials made of clay minerals or particles having a mica-derived crystalline structure, with the plastics mentioned above; composite materials formed by bonding a thin glass plate and a plastic plate made of one of the plastics mentioned above, and having at least one bonding interface between a glass plate and a plastic plate; and composite materials having a laminate structure having a barrier performance, in which at least one inorganic layer (for example, $SiO_2$, $Al_2O_3$, or $SiO_xN_y$) and at least one plastic layer made of one of the plastics mentioned above are alternately laminated. Among these, when a composite material formed by bonding a plastic resin substrate or a thin glass plate and a plastic plate made of one of the plastics mentioned above, and having at least one bonding interface between a glass plate and a plastic plate, is used, there is obtained a sensor which is light weight and has a robustness that prevents impediment to the functions even if the substrate is subject to an impact due to dropping or the like. In order to suppress the permeation of oxygen and moisture, it is preferable for the insulating substrate to have a barrier layer such as a SiON film, which is not shown in the drawings, formed over the entire surface of one side of the insulating substrate where the charge detection layer 60 is formed. The SiON film may be formed according to a CVD method, and the thickness is set at, for example, 500 nm.

The insulating substrate 10 may also have, on the surface of the side opposite to the side where the charge detection layer 60 is formed (hereinafter, also referred to as "rear surface of the insulating substrate 10"), a light shielding layer that blocks or absorbs at least a light component having a wavelength in the range of 400 nm to 460 nm. This light shielding layer blocks, or decreases the intensity of the light having a wavelength in the range of 400 nm to 460 nm, which enters the oxide semiconductor active layer 28 from the rear surface of the insulating substrate 10, and therefore, unstabilization of the operation of thin film transistor due to this light is prevented.

An example of the light shielding layer may be a binder polymer layer containing carbon black, or a dye, or a pigment which absorbs at least a light component having a wavelength in the range of 400 nm to 460 nm.

<Storage Capacitor Lower Electrode and Gate Electrode>

On the insulating substrate 10, the storage capacitor lower electrode 32 and the gate electrode 22 are formed. For example, a substrate formed by adhering of a glass plate having a thickness of 0.15 mm and a PET film having a thickness of 0.1 mm is used as the insulating substrate 10, and a film of molybdenum (Mo) is formed by sputtering to a thickness of 40 nm on the surface of the glass plate side. Then, the Mo film is patterned by photolithography to have a pattern having the respective positions and shapes corresponding to the electrodes 32 and 22.

Suitable examples of the material used for the gate electrode include metals such as aluminum (Al), molybdenum (Mo), chromium (Cr), tantalum (Ta), titanium (Ti), gold (Au), and silver (Ag); alloys such as an aluminum-neodymium (Al—Nd) alloy and a silver-palladium-copper (APC) alloy; electrically conductive films of metal oxides such as tin oxide, zinc oxide, indium oxide, indium tin oxide (ITO), and indium zinc oxide (IZO); electrically conductive organic compounds such as polyaniline, polythiophene, and polypyrrole; and mixtures thereof.

The thickness of the gate electrode 22 is set at, for example, from 10 nm to 1000 nm.

<Dielectric Layer>

Next, the dielectric layer 14 which also functions as an insulating film is formed on the gate electrode 22 and the lower storage capacitor electrode 32.

Examples of the material used in the dielectric layer 14 include inorganic oxides such as silicon dioxide; and organic polymer compounds such as an acrylic resin, a novolac resin, and a polyimide resin.

The dielectric layer 14 is formed by an appropriate method in accordance with the material used. For example, in the case of an organic oxide such as silicon dioxide, film formation is preferably carried out by sputtering. On the other hand, in the case of an organic polymer compound such as an acrylic resin or a novolac resin, the dielectric layer is formed according to a known method such as, for example, a spin coating method, a spray coating method or a screen printing method. When an organic polymer compound is used, it is preferable to further provide thereon a $SiO_2$ film to a thickness of, for example, 20 nm, by a sputtering method, a chemical vapor deposition (CVD) method or the like.

It is preferable to set the thickness of the dielectric layer 14 in the range of 100 nm to 1000 nm, from the viewpoint of the functions as a dielectric layer of the storage capacitor 30 and as an insulating film of the thin film transistor 20.

<Source/Drain Electrodes and Storage Capacitor Upper Electrode>

Next, the source electrode 24 and the drain electrode 26 of the thin film transistor (hereinafter, also referred to as "TFT") 20, and the storage capacitor upper electrode 34 of the storage capacitor (hereinafter, also referred to as "capacitor") 30 are formed on the dielectric layer 14.

An example of the material that is used to form the source electrode 24, drain electrode 26, and the storage capacitor upper electrode 34 of the storage capacitor 30 may be $In_2O_3$—ZnO (hereinafter, also referred to as "IZO"). The respective thicknesses of the electrodes 24, 26, and 34 are preferably set in the range of 10 nm to 1000 nm, because the required low electrical resistance is easily obtained.

<Oxide Semiconductor Active Layer>

The oxide semiconductor active layer 28 is formed on the source electrode 24 and the drain electrode 26 so as to extend over these two electrodes.

The oxide semiconductor active layer 28 is formed from, for example, an oxide semiconductor of an In—Ga—Zn—O system, and preferably from an amorphous oxide semiconductor. The amorphous oxide semiconductor is advantageous in that since film formation may be achieved at low temperature by sputtering, a plastic substrate may be used as the second flexible substrate 10. The oxide semiconductor is preferably an oxide containing at least one of indium (In), gadolinium (Ga) or zinc (Zn) (for example, an In—O system), more preferably an oxide containing at least two of In, Ga and Zn (for example, an In—Zn—O system, an In—Ga system, a Ga—Zn—O system), and particularly preferably an oxide containing In, Ga and Zn. The amorphous oxide of an In—Ga—Zn—O system is preferably an amorphous oxide having a composition in the crystalline state represented by the formula: $InGaO_3(ZnO)_m$ (wherein m represents a natural number of less than 6), and more preferably the formula: $InGaZnO_4$ (hereinafter, also referred to as "IGZO").

In the case of using an oxide semiconductor active layer formed from the amorphous oxide semiconductor of an In—Ga—Zn—O system as described above, film formation may be achieved at low temperature by sputtering. A film of the amorphous oxide semiconductor of an In—Ga—Zn—O system may be patterned by photolithography and etching in accordance with the respective oxide semiconductor active layers 28 to be formed. The thickness of the oxide semiconductor active layer 28 is set at, for example, 10 nm.

It is preferable to form a protective layer 29 on the oxide semiconductor active layer 28 to cover the active layer. As a result, there is obtained an advantage that the influence of moisture in the atmosphere is suppressed. A gallium oxide film is preferable as the protective layer 29. The thickness of the protective layer 29 is preferably adjusted to, for example, 10 nm or greater.

The source electrode 24, drain electrode 26, and oxide semiconductor active layer 28 may be formed in a vertically inverse manner. That is, after the oxide semiconductor active layer 28 is formed, the source electrode 24 and the drain electrode 26 may be formed thereon.

In this manner, the charge detection layer 60 that includes the storage capacitor 30 and the thin film transistor 20 therein is formed.

<First Interlayer Insulating Film>

On the charge detection layer 60, a first interlayer insulating film 38 is formed. The first interlayer insulating film 38 is formed by, for example, applying and drying an acrylic or methacrylic photosensitive resin solution on the charge detection layer 60 according to a known method such as a spin coating method, a spray coating method or a screen printing method, subsequently exposing the photosensitive resin layer so that the contact hole 39 is formed at a predetermined position, and performing a development treatment to thereby remove the photosensitive resin at the position of the contact hole 39. As a result, the first interlayer insulating film 38 having the contact hole 39 is formed on the charge detection layer 60. The contact hole 39 is formed such that the diameter at the surface that is farthest from the upper storage capacitor electrode 34 in the thickness direction of the first interlayer insulting film 38 is, for example, 14 μm, and the diameter is gradually decreased toward the upper storage capacitor electrode 34.

Instead of forming the photosensitive resin layer by applying and drying a photosensitive resin solution as described above, the photosensitive resin layer may also be formed by a so-called transfer method, in which a transfer material having a photosensitive resin layer formed in advance on a temporary support by applying and drying a photosensitive resin solution thereon, is provided, subsequently the photosensitive resin layer of this transfer material is attached on the charge detection layer 60, and then the temporary support is removed by peeling. In regard to the composition of the photosensitive resin and the transfer material used in this transfer method, those described in, for example, JP-A No. 2002-131899 may be used.

The thickness of the first interlayer insulating film 38 is preferably selected in the range of 1 μm to 100 μm, from the viewpoint that the first interlayer insulating film functions as a flattening layer for damping the surface unevenness of the charge detection layer 60, and that the contact hole 39 is satisfactorily formed.

<Charge Collection Electrode>

On the first interlayer insulating film 38 having the contact hole 39, the charge collection electrode 36 is formed. The charge collection electrode 36 is formed by sputtering film formation using a material such as ITO, IZO. The charge collection electrode 36 is electrically connected to the upper storage capacitor electrode 34 through the contact hole 39.

The thickness of the charge collection electrode 36 is set in the range of, for example, 10 nm to 1000 nm.

<Organic Photoelectric Conversion Layer>

After the charge collection electrode 36 is formed, the organic photoelectric conversion layer 40 is formed thereon. However, it is preferable to form an undercoat layer 12 before the formation of the organic photoelectric conversion layer.

<Undercoat Layer>

The undercoat layer 12 has a function of making the charge detection layer 60 and the organic photoelectric conversion layer 40 firmly adhere to each other. Preferable examples of such an undercoat layer 12 include layers formed of a sol-gel film. The sol-gel film is a film obtainable by subjecting a metal alkoxide to hydrolysis and condensation.

Examples of the metal alkoxide include an alkoxysilane, an alkoxytitanium and an alkoxyzirconium, and these compounds may be used singly, in combination of two or more kinds.

Examples of the alkoxysilane include tetramethoxysilane, tetraethoxysilane, methyltriethoxysilane, propyltriethoxysilane, and acryloyloxypropyltrimethoxysilane.

Examples of the alkoxytitanium include tetraethoxytitanium, tetraisopropoxytitanium, and tetrabutoxytitanium.

Examples of the alkoxyzirconium include tetraethoxyzirconium, tetraisopropoxyzirconium, and tetrabutoxyzirconium.

The hydrolysis or condensation reaction of the metal alkoxide can be carried out with or without solvent. For uniformly mixing components, the reaction is preferably carried out with an organic solvent. Preferable examples of the solvent include organic solvents such as alcohols, aromatic hydrocarbons, ethers, ketones, or esters. The solvent is preferably capable of dissolving the silane compound and catalyst. It is also preferable to use a solvent as a coating liquid or a part of a coating liquid from the viewpoint of the process.

Among them, examples of alcohols include monovalent or divalent alcohols. Among monovalent alcohols, saturated aliphatic alcohols having 1 to 8 carbon atoms are preferable. Specific examples of the alcohols include methanol, ethanol, n-propyl alcohol, i-propyl alcohol, n-butyl alcohol, sec-butyl alcohol, tert-butyl alcohol, ethylene glycol, diethylene glycol, triethylene glycol, ethylene glycol monobutyl ether, and ethylene glycol acetate monoethyl ether.

Specific examples of aromatic hydrocarbons include benzene, toluene, and xylene. Specific examples of ethers include tetrahydrofuran and dioxane. Specific examples of ketones include acetone, methyl ethyl ketone, methyl isobutyl ketone, and diisobutyl ketone. Specific examples of esters include ethyl acetate, propyl acetate, butyl acetate, and propylene carbonate.

These organic solvents may be used alone or in combination of two or more of them. The concentration of the solid content in the hydrolysis or condensation reaction is not particularly limited, but usually in the range of 1% by mass to 90% by mass, and preferably in the range of 20% by mass to 70% by mass.

The hydrolysis and condensation reactions of the metal alkoxide are preferably carried out in the presence of a catalyst. Examples of the catalyst include organic acids such as oxalic acid, acetic acid, formic acid, methanesulfonic acid, or toluenesulfonic acid; inorganic salt groups such as ammonia; organic bases such as triethylamine or pyridine; and metal alkoxides such as triisopropoxy aluminum or tetrabutoxy zirconium. Among them, organic acids and metal alkoxides are preferable from the viewpoints of stability of preparation and storage stability of a sol solution.

Among organic acids, organic acids having an acid dissociation constant (pKa value ($25°$ C.)) of 4.5 or lower in water are preferable, organic acids having an acid dissociation constant of 3.0 or lower in water are more preferable, organic acids having an acid dissociation constant of 2.5 or lower in water are further preferable, methanesulfonic acid, oxalic acid, phthalic acid, and malonic acid are further preferable, and oxalic acid is particularly preferable.

The hydrolysis or condensation reaction is usually carried out by adding 0.3 mol to 2 mol, and preferably 0.5 mol to 1 mol, of water relative to 1 mol of a hydrolysable group of the metal alkoxide compound, and carrying out stirring at $25°$ C. to $100°$ C. in the presence or absence of the above-mentioned solvent, preferably in the presence of the catalyst.

When the hydrolysable group is an alkoxide and the catalyst is an organic acid, the addition amount of the water may be reduced so that the carboxy group or sulfo group of the organic acid supplies protons. The addition amount of the water relative to 1 mol of the alkoxide group of the metal alkoxide is 0 mol to 2 mol, preferably 0 mol to 1.5 mol, more preferably 0 mol to 1 mol, and particularly preferably 0 mol to 0.5 mol. When an alcohol is used as the solvent, the addition of substantially no water is also preferable.

When the catalyst is an organic acid, the optimal usage of the catalyst varies with the addition amount of water, and when water is added, 0.01 mol % to 10 mol %, preferably 0.1 mol % to 5 mol % relative to the total hydrolysable groups, and when substantially no water is added, 1 mol % to 500 mol %, preferably 10 mol % to 200 mol %, more preferably 20 mol % to 200 mol %, further preferably 50 mol % to 150 mol %, and most preferably 50 mol % to 120 mol % relative to the hydrolysable groups. The reactions are carried out by stirring at $25°$ C. to $100°$ C., and preferably adjusted as appropriate according to the reactivity of the metal alkoxide.

In this manner, the hydrolysate of the metal alkoxide or a partial condensation product thereof (hereinafter, these may be referred to as "sol composition") is obtained. This sol composition is applied and converted into a gel to obtain a gel-like composition. As such, the undercoat layer containing the gel-like composition is formed.

As the above-mentioned coating method, various methods can be used, such as air doctor coating, blade coating, rod coating, extrusion coating, air knife coating, squeeze coating, impregnation coating, reverse roll coating, transfer roll coating, gravure coating, kiss-roll coating, cast coating, spray coating, or spin coating.

Gelation of the sol composition may be achieved by applying various methods. For example, it is preferable to perform a heat treatment of heating at 100° C. to 250° C., and preferably 120° C. to 200° C.

<Charge Generation Layer>

As a coating liquid for forming the charge generation layer 44 on the undercoat layer 12, a liquid obtained by dispersing a dibromoanthanthrone pigment as a charge generating agent in a cyclohexane solution of a polyvinyl butyral resin as a binder is prepared, and this coating liquid is spin-coated on the undercoat layer 12. The applied coating liquid is baked to evaporate cyclohexanone and is thereby dried. Thus, a charge generation layer 44 having a thickness of 0.1 μm is formed.

The charge generating agent that is used in the radiation sensor according to the invention is most preferably an anthanthrone such as a dibromoanthanthrone pigment, but in addition to that, preferable examples also include a pyranthrone-based compound and a polycyclic quinone-based compound.

<Charge Transport Layer>

As a coating liquid for forming the charge transport layer 42, a liquid obtained by dissolving 5 g of N,N'-diphenyl-N, N'-bis(3-methylphenyl)-4,4'-diaminobiphenyl as a charge transporting agent and 5 g of polycarbonate (weight average molecular weight 35,000 to 40,000) as a polymer binder in 35 g of methylene chloride, is prepared, and this liquid is dip-coated on the charge generation layer 44. The applied coating liquid is dried for one hour at 100° C., and thus a charge transport layer 42 having a thickness of 2 μm is formed.

Examples of the charge transporting agent include, in addition to the compound mentioned above, high molecular weight organic semiconductors such as polyvinylcarbazole, polyvinylindole and polyvinylperylene; and low molecular weight organic semiconductors such as oxadiazole, pyrazoline, thiadiazole, triazole and hydrazone.

Examples of the polymer binder include, in addition to polycarbonate, polyvinyl butyral, a homopolymer of an acrylic acid ester or a copolymer thereof with another copolymerizable monomer, a homopolymer of a methacrylic acid ester or a copolymer thereof with another copolymerizable monomer, a homopolymer of styrene or a copolymer thereof with another copolymerizable monomer such as acrylonitrile, and polysulfone.

The amount of the polymer binder contained in the charge transport layer 42 is preferably in the range of 55% by mass to 75% by mass. By doing so, the charge transport layer 42 obtains appropriate flexibility, and there is an advantage that it becomes easier to laminate the bias electrode 46 that will be described below, which is in contact with the charge transport layer 42, and the phosphor layer 50 described above, with the second insulating film 16 interposed therebetween. Also, in the case of providing the bias electrode by a sputtering method, it is not susceptible to damages by sputter particles. Moreover, even if the sensor is subjected to bending with a large curvature during the service of the sensor, the characteristics of photoelectric conversion are prevented from being deteriorated.

<Bias Electrode>

On the charge transport layer 42, the bias electrode 46 is formed. The bias electrode 46 is formed by, for example, performing film formation through sputtering using IZO to a thickness of 40 nm.

A member produced as described above, which includes the TFT 20, storage capacitor 30, organic photoelectric conversion layer 40, and bias electrode 46 on the insulating substrate 10, is referred to as member 1.

<Plastic Support>

It is advantageous, in terms of production, that the phosphor layer 50 be supported by a plastic support 18. Examples of the plastic support 18 include products formed into a film shape using plastics such as polyethylene terephthalate (PET), polyethylene naphthalate (PEN), all-aromatic polyamide, polyimide, and polycarbonate. For example, a PET film having a thickness of 200 μm is used.

<Phosphor Layer>

The phosphor layer 50 is formed by preparing a coating liquid in which a phosphor is dispersed in a binder solution, applying this coating liquid on the plastic support 18 by doctor blade coating or the like, and drying the coating liquid.

The phosphor is preferably a phosphor which, when exposed to radiation, emits converted light that includes a first light component having the maximum peak wavelength in the range of 500 nm to 600 nm, and a second light component having a wavelength in the range of 400 nm to 460 nm, which is a light component having a shorter wavelength than the first light component. Such a phosphor is most preferably gadolinium oxysulfide. The gadolinium oxysulfide compounds also include those containing terbium or the like. In addition to these, cesium iodide compounds such as cesium iodide added with titanium and cesium iodide added with tantalum are also preferable.

As the binder, polyvinyl butyral described above as well as polycarbonate and the like may be used.

The thickness of the phosphor layer 50 is selected in the range of 50 μm to 600 μm.

A member having the phosphor layer 50 formed on the plastic support 18 as such is referred to as member 2.

The member 1 and the member 2 are made to adhere to each other, with the second interlayer insulating film 16 interposed therebetween, such that the bias electrode 46 of the member 1 and the phosphor layer 50 of the member 2 face each other, and thus the radiation sensor according to the invention is obtained.

The radiation sensor according to the invention uses a thin film transistor having an oxide semiconductor active layer. Further, according to the invention, a radiation sensor having a simple structure is obtained. Therefore, the radiation sensor may be advantageously used as a radiation sensor that is mounted inside a lightweight, slim cassette. Particularly, when a plastic substrate such as a polyimide substrate is used as the insulating substrate 10, the sensor may maintain a robustness that prevents impediment to the functions even if the cassette is mistakenly dropped and the radiation sensor is subjected to an impact. Examples of the structure of such a cassette include the structure described in JP-A No. 2009-80103.

The radiation image detection apparatus using the radiation sensor according to the aspect of the invention includes a radiation irradiation apparatus, the radiation sensor described above, and a memory unit that accumulates the charge data of pixel units detected at the charge detection layer of the radiation sensor.

The charge data related to the radiation image accumulated in the memory unit are subjected to image processing as necessary, and then are stored in an image memory unit. The radiation image data that have been imaging processed and stored in the image memory unit, are controlled by a display apparatus and thereby displayed on the display unit as visible images.

The invention has been explained as shown above, but the invention is not intended to be limited to the above exemplary embodiment. For example, a glass substrate may also be used as the insulating substrate 10.

The invention includes the following exemplary embodiments.

<1> A radiation sensor comprising: a phosphor layer that converts incident radiation into converted light which contains a first light component having a first wavelength region that includes a maximum peak wavelength that is different from a maximum peak wavelength of the radiation, and a second light component having a second wavelength region of 400 nm to 460 nm, which is different from that of the radiation and different from the first wavelength region; an organic photoelectric conversion layer that photoelectrically converts the first light component to electricity; and an insulating substrate that is provided with a charge detection layer to read charges generated at the organic photoelectric conversion layer, and that includes a storage capacitor and a thin film transistor having an oxide semiconductor active layer, wherein the first and second light components each pass through the organic photoelectric conversion layer and arrive at the oxide semiconductor active layer, and wherein an intensity of the second light component that passes through the organic photoelectric conversion layer and arrives at the oxide semiconductor active layer, is lower than an intensity of the first light component that passes through the organic photoelectric conversion layer and arrives at the oxide semiconductor active layer.

<2> The radiation sensor of <1>, wherein the maximum peak wavelength of the first light component is greater than 460 nm.

<3> The radiation sensor of <1>, wherein the maximum peak wavelength of the first light component is in the range of 500 nm to 600 nm.

<4> The radiation sensor of <1>, wherein the phosphor layer comprises cesium iodide or gadolinium oxysulfide.

<5> The radiation sensor of <1>, wherein the organic photoelectric conversion layer includes a charge generation layer and a charge transport layer.

<6> The radiation sensor of <5>, wherein the charge generation layer contains anthanthrone.

<7> The radiation sensor of <5>, wherein the charge transport layer contains a charge transporting agent and 55% by mass to 75% by mass of a polymer binder.

<8> The radiation sensor of <1>, wherein the oxide semiconductor active layer is an oxide semiconductor active layer containing at least one of indium (In), gadolinium (Ga) or zinc (Zn).

<9> The radiation sensor of <8>, wherein the oxide semiconductor active layer is an oxide semiconductor active layer containing In, Ga and Zn.

<10> The radiation sensor of <1>, wherein the insulating substrate is a plastic substrate.

<11> The radiation sensor of <1>, wherein the insulating substrate comprises a composite material which is formed by joining a thin glass plate with a plastic plate, and has at least one joining interface between the glass plate and the plastic plate.

<12> The radiation sensor of <1>, wherein the phosphor layer is supported on a plastic substrate.

<13> The radiation sensor of <12>, wherein the plastic substrate is a substrate comprising polyethylene terephthalate, polyethylene naphthalate, all-aromatic polyamide, polyimide or polycarbonate.

<14> The radiation sensor of <1>, further comprising an undercoat layer comprising a sol-gel film, between the organic photoelectric conversion layer and the charge detection layer.

<15> The radiation sensor of <14>, wherein the sol-gel film is obtained by subjecting a metal alkoxide to hydrolysis and condensation.

<16> The radiation sensor of <15>, wherein the metal alkoxide is at least one of an alkoxysilane, an alkoxytitanium or an alkoxyzirconium.

<17> A radiation image detection apparatus comprising:
a radiation irradiating apparatus;
the radiation sensor of <1>; and
a memory unit that allows accumulation therein of charge data of pixel units detected at the charge detection layer of the radiation sensor.

All publications, patent applications, and technical standards mentioned in this specification are herein incorporated by reference to the same extent as if each individual publication, patent application, or technical standard was specifically and individually indicated to be incorporated by reference.

What is claimed is:
1. A radiation sensor comprising:
a phosphor layer that converts incident radiation into converted light which contains a first light component having a first wavelength region that includes a maximum peak wavelength that is different from a maximum peak wavelength of the radiation, and a second light component having a second wavelength region of 400 nm to 460 nm, which is different from that of the radiation and different from the first wavelength region;
an organic photoelectric conversion layer that photoelectrically converts the first light component to electricity; and
an insulating substrate that is provided with a charge detection layer to read charges generated at the organic photoelectric conversion layer, and that includes a storage capacitor and a thin film transistor having an oxide semiconductor active layer,
wherein the first and second light components each pass through the organic photoelectric conversion layer and arrive at the oxide semiconductor active layer, and wherein an intensity of the second light component that passes through the organic photoelectric conversion layer and arrives at the oxide semiconductor active layer, is lower than an intensity of the first light component that passes through the organic photoelectric conversion layer and arrives at the oxide semiconductor active layer.

2. The radiation sensor of claim 1, wherein the maximum peak wavelength of the first light component is greater than 460 nm.

3. The radiation sensor of claim 1, wherein the maximum peak wavelength of the first light component is in the range of 500 nm to 600 nm.

4. The radiation sensor of claim 1, wherein the phosphor layer comprises cesium iodide or gadolinium oxysulfide.

5. The radiation sensor of claim 1, wherein the organic photoelectric conversion layer includes a charge generation layer and a charge transport layer.

6. The radiation sensor of claim 5, wherein the charge generation layer contains anthanthrone.

7. The radiation sensor of claim 5, wherein the charge transport layer contains a charge transporting agent and 55% by mass to 75% by mass of a polymer binder.

8. The radiation sensor of claim 1, wherein the oxide semiconductor active layer is an oxide semiconductor active layer containing at least one of indium (In), gadolinium (Ga) or zinc (Zn).

9. The radiation sensor of claim 8, wherein the oxide semiconductor active layer is an oxide semiconductor active layer containing In, Ga and Zn.

10. The radiation sensor of claim 1, wherein the insulating substrate is a plastic substrate.

11. The radiation sensor of claim 1, wherein the insulating substrate comprises a composite material which is formed by joining a thin glass plate with a plastic plate, and has at least one joining interface between the glass plate and the plastic plate.

12. The radiation sensor of claim 1, wherein the phosphor layer is supported on a plastic substrate.

13. The radiation sensor of claim 12, wherein the plastic substrate is a substrate comprising polyethylene terephthalate, polyethylene naphthalate, all-aromatic polyamide, polyimide or polycarbonate.

14. The radiation sensor of claim 1, further comprising an undercoat layer comprising a sol-gel film, between the organic photoelectric conversion layer and the charge detection layer.

15. The radiation sensor of claim 14, wherein the sol-gel film is obtained by subjecting a metal alkoxide to hydrolysis and condensation.

16. The radiation sensor of claim 15, wherein the metal alkoxide is at least one of an alkoxysilane, an alkoxytitanium or an alkoxyzirconium.

17. A radiation image detection apparatus comprising:
a radiation irradiating apparatus;
the radiation sensor of claim 1; and
a memory unit that allows accumulation therein of charge data of pixel units detected at the charge detection layer of the radiation sensor.

* * * * *